United States Patent
Huang et al.

(10) Patent No.: US 11,740,071 B2
(45) Date of Patent: Aug. 29, 2023

(54) OPTICAL INTERFEROMETRY PROXIMITY SENSOR WITH TEMPERATURE VARIATION COMPENSATION

(71) Applicant: Apple Inc., Cupertino, CA (US)

(72) Inventors: Mengshu Huang, Cupertino, CA (US); James J. Dudley, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 1103 days.

(21) Appl. No.: 16/230,967

(22) Filed: Dec. 21, 2018

(65) Prior Publication Data

US 2020/0200522 A1 Jun. 25, 2020

(51) Int. Cl.
| | |
|---|---|
| *G01B 9/02* | (2022.01) |
| *H01S 5/026* | (2006.01) |
| *H01S 5/183* | (2006.01) |
| *G01N 15/14* | (2006.01) |

(Continued)

(52) U.S. Cl.
CPC ..... *G01B 9/02092* (2013.01); *G01N 15/1434* (2013.01); *H01S 5/0264* (2013.01); *H01S 5/02257* (2021.01); *H01S 5/183* (2013.01); *G01N 2015/1075* (2013.01); *G01N 2015/1438* (2013.01); *G01N 2015/1452* (2013.01)

(58) Field of Classification Search
CPC .............. G01B 9/02092; G01B 9/0207; G01N 15/1434; G01N 2015/1075; G01N 2015/1438; G01N 2015/1452; H01S 5/02257; H01S 5/0264; H01S 5/183; H01S 5/02253; H01S 5/0617; H01S 5/02208; H01S 5/0427; H01S 5/423; H01S 5/0028; G01S 7/4916; G01S 7/497; G01S 17/32; G01S 17/58
See application file for complete search history.

(56) References Cited

U.S. PATENT DOCUMENTS

| | | |
|---|---|---|
| 4,254,333 A | 3/1981 | Bergström |
| 4,468,131 A | 8/1984 | Bui et al. |
| 4,913,547 A | 4/1990 | Moran |

(Continued)

FOREIGN PATENT DOCUMENTS

| | | |
|---|---|---|
| CH | 706101 | 12/1978 |
| CN | 101592762 | 12/2009 |

(Continued)

OTHER PUBLICATIONS

U.S. Appl. No. 16/408,295, filed May 9, 2019, Mutlu et al.

(Continued)

*Primary Examiner* — Mohamed K Amara
(74) *Attorney, Agent, or Firm* — Brownstein Hyatt Farber Schreck, LLP

(57) ABSTRACT

An optical proximity sensor includes a first vertical cavity surface-emitting laser configured for self-mixing interferometry to determine distance to and/or velocity of an object. The optical proximity sensor also includes a second vertical cavity surface-emitting laser configured for self-mixing interferometry to determine whether any variation in a fixed distance has occurred. The optical proximity sensor leverages output from the second vertical cavity surface-emitting laser to calibrate output from the second vertical cavity surface-emitting laser to eliminate and/or mitigate environmental effects, such as temperature changes.

18 Claims, 13 Drawing Sheets

(51) Int. Cl.
*H01S 5/02257* (2021.01)
*G01N 15/10* (2006.01)

(56) References Cited

U.S. PATENT DOCUMENTS

| | | | |
|---|---|---|---|
| 5,500,708 A | 3/1996 | Ohsawa | |
| 5,781,297 A | 7/1998 | Castore | |
| 5,825,465 A | 10/1998 | Nerin et al. | |
| 6,233,045 B1 | 5/2001 | Suni et al. | |
| 6,531,767 B2* | 3/2003 | Shrauger | H01L 23/15 |
| | | | 385/35 |
| 6,707,027 B2 | 3/2004 | Liess et al. | |
| 6,816,523 B1 | 11/2004 | Glenn et al. | |
| 6,872,931 B2 | 3/2005 | Liess et al. | |
| 7,139,446 B2 | 11/2006 | Slotwinski | |
| 7,277,180 B2 | 10/2007 | Townley-Smith et al. | |
| 7,336,368 B2 | 2/2008 | Liao et al. | |
| 7,388,672 B2 | 6/2008 | Zhou et al. | |
| 7,509,050 B2 | 3/2009 | Ekkizogloy et al. | |
| 7,557,795 B2 | 7/2009 | Kong et al. | |
| 7,589,709 B2 | 9/2009 | Liess et al. | |
| 7,620,332 B2 | 11/2009 | Nishiyama | |
| 7,667,851 B2 | 2/2010 | Dubois et al. | |
| 7,675,020 B2 | 3/2010 | Machida | |
| 7,995,193 B2 | 8/2011 | Kuwata | |
| 8,174,597 B2* | 5/2012 | Ogasawara | H04N 25/75 |
| | | | 348/207.99 |
| 8,208,814 B2 | 6/2012 | Sheth et al. | |
| 8,378,287 B2 | 2/2013 | Schemmann et al. | |
| 8,405,902 B2 | 3/2013 | Irie | |
| 8,416,424 B2 | 4/2013 | Werner et al. | |
| 8,446,592 B1 | 5/2013 | Arissian | |
| 8,529,460 B2* | 9/2013 | Kawano | A61B 5/0261 |
| | | | 356/28.5 |
| 8,736,581 B2 | 5/2014 | Han et al. | |
| 8,896,745 B2 | 11/2014 | Takachi | |
| 8,942,069 B2 | 1/2015 | Tortora | |
| 9,004,698 B2 | 4/2015 | Kilcher et al. | |
| 9,091,573 B2 | 7/2015 | Van Der Lee et al. | |
| 9,091,747 B2 | 7/2015 | Pruijmboom | |
| 9,146,304 B2 | 9/2015 | Land et al. | |
| 9,160,390 B2 | 10/2015 | Zhou et al. | |
| 9,420,155 B2 | 8/2016 | Brodie | |
| 9,453,939 B2 | 9/2016 | Tortora et al. | |
| 9,459,352 B2 | 10/2016 | Becker et al. | |
| 9,547,280 B2 | 1/2017 | Born et al. | |
| 9,588,586 B2 | 3/2017 | Rihn | |
| 9,648,221 B2 | 5/2017 | Seo et al. | |
| 9,658,113 B2 | 5/2017 | Bosch et al. | |
| 9,677,986 B1 | 6/2017 | Baldwin et al. | |
| 9,703,173 B2 | 7/2017 | Brodie | |
| 9,726,474 B2 | 8/2017 | Royo Royo et al. | |
| 9,772,398 B2 | 9/2017 | Bikumandla et al. | |
| 9,778,037 B2 | 10/2017 | Bestler | |
| 9,911,890 B2 | 3/2018 | Renard et al. | |
| 9,912,923 B2 | 3/2018 | Kilcher et al. | |
| 9,952,245 B2 | 4/2018 | Ueno | |
| 9,995,877 B2 | 6/2018 | Nakamura | |
| RE46,930 E | 7/2018 | Mimeault | |
| 10,070,799 B2 | 9/2018 | Ang et al. | |
| 10,184,783 B2 | 1/2019 | Flanders et al. | |
| 10,222,474 B1 | 3/2019 | Raring et al. | |
| 10,317,651 B2 | 6/2019 | Furutake et al. | |
| 10,386,554 B2 | 8/2019 | Hjelmstrom et al. | |
| 10,492,679 B2 | 12/2019 | Zhou | |
| 10,503,048 B2 | 12/2019 | Del Bino et al. | |
| 10,613,625 B2 | 4/2020 | Huang et al. | |
| 10,614,295 B2 | 4/2020 | Kim et al. | |
| 10,635,800 B2 | 4/2020 | Bakish | |
| 10,705,211 B2 | 7/2020 | Jacobs et al. | |
| 10,791,283 B2 | 9/2020 | Bardagjy et al. | |
| 10,824,275 B2 | 11/2020 | Mutlu et al. | |
| 10,845,873 B2 | 11/2020 | Huang | |
| 10,866,083 B2* | 12/2020 | Van Der Lee | G01S 7/4916 |
| 10,871,836 B2 | 12/2020 | Dashevsky | |
| 11,073,615 B2 | 7/2021 | Chua et al. | |
| 11,112,233 B2 | 9/2021 | Mutlu et al. | |
| 11,150,332 B1 | 10/2021 | Chen et al. | |
| 11,156,456 B2* | 10/2021 | Chen | G03B 13/20 |
| 11,157,113 B2 | 10/2021 | Winkler et al. | |
| 11,175,700 B1 | 11/2021 | Poole | |
| 11,243,068 B1 | 2/2022 | Mutlu et al. | |
| 11,243,686 B2 | 2/2022 | McCord | |
| 2005/0156874 A1 | 7/2005 | Kong | |
| 2005/0157971 A1 | 7/2005 | Juijve | |
| 2005/0286593 A1* | 12/2005 | Guenter | H01S 5/0264 |
| | | | 372/50.1 |
| 2005/0286595 A1* | 12/2005 | Guenter | H01S 5/0264 |
| | | | 372/50.1 |
| 2006/0239312 A1 | 10/2006 | Kewitsch et al. | |
| 2008/0123106 A1 | 5/2008 | Zeng et al. | |
| 2008/0181354 A1* | 7/2008 | Ueno | G01S 7/4916 |
| | | | 377/28 |
| 2009/0002829 A1 | 1/2009 | Shinohara | |
| 2010/0073683 A1* | 3/2010 | Ueno | G01S 17/04 |
| | | | 356/498 |
| 2011/0035093 A1* | 2/2011 | Moench | G01S 17/88 |
| | | | 701/31.4 |
| 2011/0118943 A1* | 5/2011 | Han | B60R 21/00 |
| | | | 356/28 |
| 2011/0126617 A1 | 6/2011 | Bengoechea Apezteguia et al. | |
| 2011/0267467 A1 | 11/2011 | Kimura et al. | |
| 2012/0281221 A1 | 11/2012 | Studer et al. | |
| 2014/0293055 A1 | 10/2014 | Otsuka | |
| 2015/0309568 A1 | 10/2015 | Miki | |
| 2016/0021285 A1 | 1/2016 | Nadler et al. | |
| 2017/0090599 A1* | 3/2017 | Kuboyama | H03K 17/962 |
| 2017/0192133 A1 | 7/2017 | Murakami et al. | |
| 2017/0343817 A1 | 11/2017 | Bietry et al. | |
| 2017/0351049 A1 | 12/2017 | Yong et al. | |
| 2017/0374261 A1 | 12/2017 | Teich et al. | |
| 2018/0073924 A1 | 3/2018 | Steinmann et al. | |
| 2018/0080758 A1 | 3/2018 | Chen et al. | |
| 2018/0081434 A1 | 3/2018 | Siddiqui et al. | |
| 2018/0132043 A1 | 5/2018 | Bakish | |
| 2018/0209779 A1* | 7/2018 | Van Der Lee | G01N 15/06 |
| 2018/0224368 A1* | 8/2018 | Spruit | G01N 15/06 |
| 2019/0090068 A1* | 3/2019 | Fishman | H01S 5/0028 |
| 2019/0146065 A1 | 5/2019 | Jutte et al. | |
| 2019/0317454 A1 | 10/2019 | Holenarsipur et al. | |
| 2019/0317639 A1* | 10/2019 | Winkler | G01S 17/50 |
| 2019/0319157 A1 | 10/2019 | Coffy et al. | |
| 2019/0391539 A1 | 12/2019 | Perkins et al. | |
| 2020/0064249 A1* | 2/2020 | Momtahan | G01N 15/0211 |
| 2020/0072740 A1 | 3/2020 | Venturini et al. | |
| 2020/0103274 A1 | 4/2020 | Garrett et al. | |
| 2020/0309661 A1 | 10/2020 | Spruit et al. | |
| 2020/0356159 A1 | 11/2020 | Mutlu et al. | |
| 2020/0370879 A1 | 11/2020 | Mutlu et al. | |
| 2020/0370886 A1* | 11/2020 | Chen | G01S 17/88 |
| 2020/0374620 A1* | 11/2020 | McCord | G06F 3/04883 |
| 2021/0003385 A1* | 1/2021 | Tan | G01B 9/02092 |
| 2021/0011559 A1* | 1/2021 | Mutlu | G06F 3/0304 |
| 2021/0015350 A1 | 1/2021 | Butte et al. | |
| 2021/0080245 A1* | 3/2021 | Mutlu | G01B 9/02041 |
| 2021/0104873 A1 | 4/2021 | Gerlach | |
| 2021/0116355 A1* | 4/2021 | Spruit | G01N 15/1431 |
| 2021/0294489 A1 | 9/2021 | Li et al. | |
| 2022/0003543 A1 | 1/2022 | Chen et al. | |
| 2022/0099436 A1 | 3/2022 | Chen et al. | |
| 2022/0155052 A1 | 5/2022 | Mutlu et al. | |
| 2022/0202515 A1 | 6/2022 | Itkowitz et al. | |
| 2022/0244041 A1 | 8/2022 | Chen et al. | |
| 2022/0404138 A1 | 12/2022 | Mutlu et al. | |
| 2023/0087691 A1 | 3/2023 | Chen et al. | |

FOREIGN PATENT DOCUMENTS

| | | |
|---|---|---|
| CN | 102109650 | 6/2011 |
| CN | 105223579 | 1/2016 |
| CN | 107564924 | 1/2018 |
| CN | 108225543 | 6/2018 |
| CN | 108692663 | 4/2020 |

(56) References Cited

FOREIGN PATENT DOCUMENTS

| EP | 3796140 | | | 3/2021 | | |
|---|---|---|---|---|---|---|
| GB | 2443662 | A | * | 5/2008 | .............. | G01P 3/366 |
| JP | 2004513348 | A | * | 4/2004 | .............. | G01P 13/00 |
| JP | 2005528682 | | | 9/2005 | | |
| JP | 2010526315 | | | 7/2010 | | |
| JP | 2011523700 | | | 8/2011 | | |
| JP | 2013508717 | | | 3/2013 | | |
| JP | 2019515258 | | | 6/2019 | | |
| JP | 2019121691 | | | 7/2019 | | |
| WO | WO 05/013517 | | | 2/2005 | | |
| WO | WO 09/156937 | | | 12/2009 | | |
| WO | WO 10/001299 | | | 1/2010 | | |
| WO | WO 10/139144 | | | 12/2010 | | |
| WO | WO 12/049561 | | | 4/2012 | | |
| WO | WO-2012049561 | A1 | * | 4/2012 | ........... | G01B 11/026 |
| WO | WO 17/178711 | | | 10/2017 | | |
| WO | WO 18/036685 | | | 3/2018 | | |
| WO | WO 19/015623 | | | 1/2019 | | |
| WO | WO 19/042953 | | | 3/2019 | | |

OTHER PUBLICATIONS

U.S. Appl. No. 16/418,875, filed May 21, 2019, Chen et al.

Liess et al., "A miniaturized multidirectional optical motion sensor and input device based on laser self-mixing," *Measurement Science and Technology*, vol. 13, 2002, pp. 2001-2006.

Lim et al, "Displacement and Distance Measurement Using the Change in Junction Voltage Across a Laser Diode due to the Self-Mixing Effect," Proceeding of SPIE, vol. 6038, 603810, 2006, 10 pages.

U.S. Appl. No. 16/773,827, filed Jan. 27, 2020, Mutlu et al.

U.S. Appl. No. 16/827,646, filed Mar. 23, 2020, Li et al.

U.S. Appl. No. 16/849,826, filed Apr. 15, 2020, Mutlu et al.

U.S. Appl. No. 16/917,891, filed Jun. 30, 2020, Chen et al.

U.S. Appl. No. 16/141,888, filed Sep. 25, 2018, Mutlu et al.

U.S. Appl. No. 16/141,912, filed Sep. 25, 2018, Mutlu et al.

Diao et al., "High-speed high-resolution heterodyne interferometer using a laser with low beat frequency," Applied Optics, vol. 55, No. 1, 2015, pp. 110-116.

* cited by examiner

OPTICAL INTERFEROMETRY PROXIMITY SENSOR WITH TEMPERATURE VARIATION COMPENSATION

FIELD

Embodiments described herein relate to optical sensors, and, in particular, to optical interferometry proximity sensors configured to determine a distance to, and/or velocity of, an object.

BACKGROUND

An electronic device can include a system or sensor—referred to herein as a "proximity sensor"—to measure or estimate a distance separating that electronic device in free space from an object or surface, such as a user of the electronic device.

However, conventional proximity sensors are often highly susceptible to changes in temperature. More specifically, thermal expansion or contraction of a conventional proximity sensor often results in changes to one or more electrical and/or optical properties of the proximity sensor. As such, electronic devices requiring accurate output from conventional proximity sensors are typically burdened with a requirement to incorporate additional components or systems to compensate for effects of temperature, thereby increasing design complexity, component cost, and power consumption.

SUMMARY

Embodiments described herein reference an optical proximity sensor including two discrete vertical cavity surface-emitting lasers. Both vertical cavity surface-emitting lasers are configured for self-mixing interferometry.

The first vertical cavity surface-emitting laser is configured to illuminate an object to determine a distance to and/or a velocity of that object based on self-mixing interferometry. The second vertical cavity surface-emitting laser is configured to illuminate a surface a known distance away (e.g., an interior surface of a housing enclosing the optical proximity sensor).

In this manner, the optical proximity sensor leverages output from the second vertical cavity surface-emitting laser to calibrate output of the first vertical cavity surface-emitting laser. In this manner, calibrated measurements obtained from the first vertical cavity surface-emitting laser are substantially independent of any effects of temperature or other environmental conditions.

BRIEF DESCRIPTION OF THE DRAWINGS

Reference will now be made to representative embodiments illustrated in the accompanying figures. It should be understood that the following descriptions are not intended to limit this disclosure to one included embodiment. To the contrary, the disclosure provided herein is intended to cover alternatives, modifications, and equivalents as may be included within the spirit and scope of the described embodiments, and as defined by the appended claims.

The use of the same or similar reference numerals in different figures indicates similar, related, or identical items.

Figure 1:
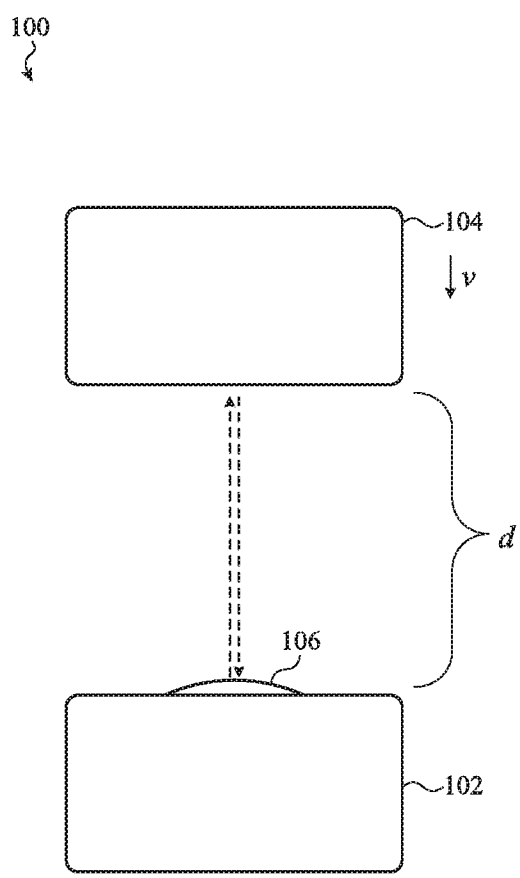
FIG. 1 depicts a schematic representation of an electronic device incorporating a proximity sensor, such as described herein, to determine a distance to, and/or a velocity of, an object near the electronic device.

The use of cross-hatching or shading in the accompanying figures is generally provided to clarify the boundaries between adjacent elements and to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Similarly, certain accompanying figures include vectors, rays, traces and/or other visual representations of one or more example paths—which may include reflections, refractions, diffractions, and so on, through one or more mediums—that may be taken by one or more photons originating from one or more light sources shown or, in some cases, omitted from, the accompanying figures. It is understood that these simplified visual representations of light are provided merely to facilitate an understanding of the various embodiments described herein and, accordingly, may not necessarily be presented or illustrated to scale or with angular precision or accuracy, and, as such, are not intended to indicate any preference or requirement for an illustrated embodiment to receive, emit, reflect, refract, focus, and/or diffract light at any particular illustrated angle, orientation, polarization, color, or direction, to the exclusion of other embodiments described or referenced herein.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Embodiments described herein relate to an optical proximity sensor for an electronic device. These embodiments typically include a vertical cavity surface-emitting laser ("VCSEL") oriented to radiate a beam of light toward an object near the optical proximity sensor in order to determine a distance to that object and/or a velocity of that object relative to the optical proximity sensor. A distance to the object and/or a velocity of the object can be determined based on a reflection of the radiated beam from an external surface of the object. The object can be internal to, or external to, the electronic device incorporating the optical proximity sensor. The beam of light may be coherent (e.g., with all photons having the same frequency and phase) or may have a wavelength modulated according to a particular pattern, referred to herein as "wavelength modulation."

For simplicity of description, example embodiments are understood to reference a VCSEL configured to emit light in a spectral range that includes a non-visible frequency band (e.g., infrared or ultraviolet light). However, it may be appreciated that this is merely one example and that in other embodiments, more than one VCSEL can be used (e.g., an array of VCSELs disposed in any suitable pattern) or, additionally or alternatively, one or more VCSELs configured to emit light in a spectral range including a visible frequency band can be used. Further, although not required for all embodiments, the example VCSEL described in reference to many embodiments that follow is understood to be a Class 1 laser as defined by the American National Standards Association; in other cases, higher power lasers may be used.

As noted above, a beam emitted from a VCSEL of an optical proximity sensor may be reflected from an object. At least a portion of the reflected light can be directed back into the VCSEL to return to (i.e., reenter) a quantum well layer of the VCSEL, interfering with the operation thereof and changing an electrical property of the VCSEL the change in the electrical and/or optical property of the VCSEL is related to (1) the distance from the optical proximity sensor to the surface of the object and (2) the wavelength of light emitted by the VCSEL.

It may be appreciated that, because the wavelength of light emitted by the VCSEL—whether modulated or fixed—is known, any measured interference (also referred to as "self-mixing" effects) can be correlated to the absolute distance separating the surface of the object and the optical proximity sensor, for example by counting interference mode hops or by quantifying a property of a beat frequency (e.g., via frequency domain analysis). This distance is referred to herein as the "measured distance" separating the optical proximity sensor and the surface of the object. As may be appreciated, this construction leverages an effect typically referred to as "self-mixing" interferometry or reflectometry.

In many embodiments, a second VCSEL can also be used (referred to herein as an "auxiliary" VCSEL). The auxiliary VCSEL can be positioned near the first VCSEL (also referred to herein as the "primary" VCSEL) such that the two experience a substantially identical thermal environment. In these constructions, the auxiliary VCSEL can be oriented to emit a beam of light toward a surface a fixed and known distance away from the auxiliary VCSEL, such as an internal surface of an enclosure of the optical proximity sensor. In these examples, a distance measurement obtained from the auxiliary VCSEL can be used to calibrate, in substantially real time, distance and/or velocity measurements obtained from the primary VCSEL.

These foregoing and other embodiments are discussed below with reference to FIGS. 1A-12. However, those skilled in the art will readily appreciate that the detailed description given herein with respect to these figures is for explanatory purposes only and should not be construed as limiting.

FIG. 1 depicts a schematic representation 100 of an electronic device 102 configured to measure a distance d to an object 104 and/or a velocity v of the object 104 relative to an optical proximity sensor 106 disposed within a housing of the electronic device 102.

The optical proximity sensor 106 can include one or more VCSEL light sources—including a primary VCSEL light source and an auxiliary VCSEL light source—formed onto a substrate or semiconductor die; for simplicity of illustration and description the illustrated embodiment omits many of these elements, which are described in greater detail in reference to other figures presented herein.

The VCSEL light source(s) of the optical proximity sensor 106 can be formed in a pattern or array, although this may not be required. The VCSEL light sources of the optical proximity sensor 106 can be formed from any number of suitable materials or combinations of materials. In one example embodiment, the VCSEL light sources of the optical proximity sensor 106 each include, without limitation or express requirement: a first distributed Bragg reflector layer; an oxide layer defining an emission aperture; a quantum well layer; a second distributed Bragg reflector layer; and so on. In other examples, additional or fewer layers may be required. For simplicity of description, two VCSEL light sources of the optical proximity sensor 106 are referenced below—a primary VCSEL light source configured to emit light toward the object 104 and an auxiliary VCSEL light source configured to emit light toward a surface (not shown) a fixed distance away from the auxiliary VCSEL light source.

In many cases, the primary VCSEL light source and the auxiliary VCSEL light source of the optical proximity sensor 106 are each disposed within the same protective enclosure, potting, or encapsulation (including any housing or enclosure of the electronic device 102) to prevent damage.

As noted above, the primary VCSEL light source of the optical proximity sensor 106 can be used to determine a distance d to and/or a velocity v of the object 104. For example, in one embodiment, wavelength modulation may be used by the optical proximity sensor 106 to simultaneously detect distance d to, and velocity v of, the object 104 relative to the optical proximity sensor 106. Wavelength modulation can be achieved by modulating a drive current supplied to the VCSEL.

One example wavelength modulation leverages a triangular waveform including an "up cycle" (in which current supplied to the primary VCSEL and, correspondingly, wavelength of the radiated beam emitted therefrom increase linearly at a particular rate) and a "down cycle" (in which current supplied to the primary VCSEL and wavelength of the radiated beam emitted therefrom decrease linearly at the same particular rate). In this example, the undulation in wavelength can effectively simulate motion of the object 104 toward and away from the optical proximity sensor 106, whether or not that object 104 is actually moving. In these examples, frequency content of power output from the primary VCSEL—affected by self-mixing interference effects—can be described by Equation 1, presented below.

More specifically, in Equation 1 (below), the quantity $f_t$ denotes a frequency at which power output from the primary VCSEL of the optical proximity sensor 106 is modulated at a particular time t when the primary VCSEL of the optical proximity sensor 106 is emitting light at a wavelength λ.

It may be appreciated that as the absolute distance d to the object changes (which is equal to half of the total round-trip distance, $d_{rt}$), light received by the primary VCSEL at time t will have a different wavelength than the light emitted by the primary VCSEL at the same time t because the wavelengths of the two beams differ by an amount related to the rate of change over time in wavelength $$\frac{d\lambda}{dt}$$

multiplied by the total round-trip flight time required for the previously-emitted light to traverse the round-trip distance $d_{rt}$ from the primary VCSEL to the object and back.

In this manner, power output from the primary VCSEL follows the triangular waveform (e.g., a current injected into the VCSEL light source at a rate of $$\frac{dI}{dt}).$$

In addition, power output from the primary VCSEL has an interference signal superimposed upon that triangular waveform that corresponds to the effects of constructive or destructive interference that results from different wavelengths of light interfering with one another in specific ways.

More specifically, the superimposed interference corresponds to the number of constructive and destructive interference "mode" transitions (e.g., also referred to as a beat frequency) that occur between two specific wavelengths of light that are determined based on the absolute distance to—or, more specifically, the round-trip time required to travel to and from—the object and based on the rate of change in wavelength $$\frac{d\lambda}{dt}$$

which, in turn, is based on the rate of change in current injected into the VCSEL light source $$\frac{d\lambda}{dt}.$$

Phrased in another manner, a wavelength of light emitted from the primary VCSEL at time $t_0$ is different from a wavelength of light emitted from the primary VCSEL at time $t_1$ by an amount determined by the rate of change in wavelength $$\frac{d\lambda}{dt}.$$

In this manner, because different wavelengths of light are emitted at different times (based on the rate of change $$\frac{d\lambda}{dt}),$$

different wavelengths of light will be received at within the primary VCSEL based on the time at which that particular wavelength was emitted.

As such, generally and broadly, it may be appreciated that the frequency content of the power output from the primary VCSEL (e.g., quantity $f_t$) is directly related to the absolute distance separating the primary VCSEL and the object 104. The auxiliary VCSEL may operate on the same principle.

Further, it may be appreciated that, quantity $f_t$ may increase or decrease as a result of one or more Doppler effects resulting from the velocity v of the object 104. For example, if the object 104 is moving toward the optical proximity sensor (e.g., parallel to the direction of propagation of the emitted beam), the frequency $f_t$ may increase. Alternatively, if the object 104 is moving away from the optical proximity sensor (e.g., parallel to the direction of propagation of the emitted beam), the frequency $f_t$ may decrease.

Equation 1, relating the values referenced above, follows:

$$f_t = \frac{d\lambda}{dt} \cdot \frac{d_{rt}}{\lambda^2} \pm \frac{2v}{\lambda} \qquad \text{Equation 1}$$

In a more general form, the direction of motion of the object 104—or more particularly, the angle θ of motion of the object 104 relative to the direction of propagation of the emitted beam—can also be considered. Equation 2, representing this more general form, follows:

$$f_t = \frac{d\lambda}{dt} \cdot \frac{d_{rt}}{\lambda^2} \pm \frac{2v}{\lambda}\cos(\theta) \qquad \text{Equation 2}$$

Using either Equation 1 or Equation 2, it may be appreciated that the distance to the object 104, represented by $$\frac{d_{rt}}{2},$$

and the velocity of that object 104 v, can be readily determined by monitoring one or more characteristics of the frequency content of the power consumed by the primary VCSEL during the up cycle and down cycle of a triangular modulation waveform. As described in reference to certain embodiments that follow, these measurements obtained from the primary VCSEL can be calibrated, adjusted, or otherwise modified in response to a similar measurement obtained from the auxiliary VCSEL.

In many embodiments, the optical proximity sensor 106 is configured to leverage triangular waveform modulation to obtain both distance and velocity information from a VCSEL (or array of VCSELs), such as the primary VCSEL, although it may be appreciated that this is merely one example and that other constructions and modulation techniques may be used.

Notwithstanding the foregoing, it may be appreciated that environmental conditions such as temperature and/or barometric pressure can affect one or more electrical properties of the primary VCSEL which, in turn, can decrease accuracy or precision of any calculation(s) based thereon (e.g., determinations of an object's distance, velocity, acceleration, and so on).

For example, as temperature or pressure changes, mechanical expansion or contraction may change physical proportions of a Bragg reflector and/or a quantum well layer of the primary VCSEL, which in turn may result in a change in the wavelength or modulation of light emitted from that primary VCSEL. In another example, as temperature changes, electrical resistance of the primary VCSEL will likewise change, decreasing the reliability of any measurements or operations that may be based on, or may require, precise voltage, current, or resistance. In still further cases, as temperature or pressure changes refractive index(es) of one or more portions of the primary VCSEL, which in turn may result in a change in the wavelength of light emitted from the primary VCSEL.

Accordingly, and as noted above, the optical proximity sensor 106 also includes the auxiliary VCSEL, which is positioned next to (e.g., on the same die or substrate), and typically but not necessarily constructed in the same manner as, the primary VCSEL. In many embodiments, the auxiliary VCSEL is thermally coupled to the primary VCSEL via a thermal coupling such that the primary VCSEL and the auxiliary VCSEL experience the same thermal environment.

More broadly, as a result of the physical proximity, thermal coupling, and/or similar (or identical) construction, it may be appreciated that the primary VCSEL and the auxiliary VCSEL in these constructions experience substantially identical environmental conditions.

In certain of these embodiments, the auxiliary VCSEL of the optical proximity sensor 106 is oriented to radiate a coherent beam of light toward a fixed reflective surface near, or within, the optical proximity sensor 106 (not shown). In many examples, the reflective surface is disposed substantially perpendicular to a propagation direction of that beam. The reflective surface is separated from the auxiliary VCSEL by a fixed and known distance referred to herein as the "reference distance."

In these examples, the beam radiated from the auxiliary VCSEL (which is typically modulated in the same manner as the primary VCSEL) reflects from the reflective surface, resulting in self-mixing interference. As with the primary VCSEL, the self-mixing interference effects experienced by the auxiliary VCSEL correspond to (1) the reference distance and (2) the wavelength or modulation of light emitted by the auxiliary VCSEL. It may be appreciated that because both of these values are known, the self-mixing interference effects experienced by the auxiliary VCSEL are substantially constant while environmental conditions of the optical proximity sensor remain the same.

As a result of this example construction, self-mixing effects experienced by the auxiliary VCSEL can be leveraged as a reference to cancel or mitigate effects of environmental conditions, on the primary VCSEL, such as changes in temperature or barometric pressure.

In view of the foregoing, more generally and broadly, embodiments described herein relate to an optical proximity sensor—such as the optical proximity sensor 106—that leverages self-mixing interferometry to: (1) measure a variable distance and/or velocity to a surface or object; and (2) to measure variances or changes, if any, in a reference distance. Thereafter, the optical proximity sensor or, more specifically, a processing unit, circuit, or other controller of the optical proximity sensor, adjusts the measured variable distance in proportion to a variance detected in the reference distance. More simply, an optical proximity sensor, such as described herein, uses a measurement of a reference distance to calibrate—in real time—measurements of a variable distance. This construction has the effect, in many embodiments, of substantially reducing variability due to environmental conditions, such as temperature.

Any stationary or portable electronic device can incorporate an optical proximity sensor, such as described herein. Example electronic devices include, but are not limited to: mobile phone devices; tablet devices; laptop devices; desktop computers; computing accessories; peripheral input devices; home or business networking devices; aerial, marine, submarine, or terrestrial vehicle control devices or networking devices; mobile entertainment devices; augmented reality devices; virtual reality devices; industrial control devices; digital wallet devices; home or business security devices; wearable devices; head-mounted devices; hand-held controllers; health or medical devices; implantable devices; clothing-embedded devices; fashion accessory devices; home or industrial appliances; media appliances; and so on.

Similarly, the optical proximity sensor 106 can be leveraged by an electronic device for a number of suitable purposes. Example purposes include, but are not limited to: detecting distance and velocity of a user's finger (or other object, such as a stylus) to an input surface or component of the electronic device; detecting distance and velocity of a user's body (or any other object) to an input surface or component of the electronic device; detecting deflection in a surface of a housing of the electronic device due to a deformation caused by an application of force (e.g., by a user or other object, such as a stylus); and the like.

Similarly, the optical proximity sensor 106 can be manufactured or constructed in a number of suitable ways. Examples include, but are not limited to: a primary VCSEL positioned on the same die as an auxiliary VCSEL and disposed within an opaque enclosure defining a single transparent aperture aligned above the primary VCSEL; a primary VCSEL positioned on the same die as an auxiliary VCSEL and disposed within a transparent enclosure having a reflective material disposed above the auxiliary VCSEL; a single VCSEL disposed within an enclosure having a partially reflective material disposed above the VCSEL; and the like.

Similarly, the optical proximity sensor 106 can include any number of suitable optical adapters, lenses, or beam-shaping elements. Examples include, but are not limited to: reflectors; mirrors; translucent lens windows; transparent lens windows; concave lenses; convex lenses; tilted lenses;

microlenses; macro lenses; collimators; polarizers; color filters; infrared-cut filters; infrared-pass filters; fiber optic cables; and the like.

In many embodiments, the optical proximity sensor 106 includes a component enclosure formed from a plastic or acrylic material; other conductive or non-conductive/insulating materials including glass and metal may also be suitable. The component enclosure can be formed from a single material or, alternatively, can be formed from multiple layers or regions of different materials joined together in a suitable manner (e.g., by adhesive, welding, and the like).

The component enclosure of the optical proximity sensor 106 can be opaque or transparent, or may include transparent regions and opaque regions. The component enclosure can include one or more reflective areas or regions.

In many embodiments, the component enclosure includes a lens or window disposed in an aperture defined through, or formed within, the component enclosure. Typically, the lens or window is disposed directly above, and aligned with, at least one of the VCSEL light sources. As a result of this construction, a beam of light emitted/radiated from at least one of the VCSEL light sources can propagate outwardly from the component enclosure of the optical proximity sensor 106. As an additional result of this construction, one or more reflections of an emitted/radiated beam that may reflect from a surface of the object 104 can be received by at least one of the VCSEL light sources.

In many embodiments, the optical proximity sensor 106 also includes one or more photodiodes disposed adjacent to, or integrated in, each of the VCSEL light sources. In these examples, the optical proximity sensor 106 (or, more specifically, a circuit or processor of, or communicably coupled to, the optical proximity sensor 106) can monitor power output from a photodiode to determine one or more performance characteristics, such as modulation frequency of that power output of a particular VCSEL light source. (see, e.g., Equations 1-2). It may be appreciated, however, that this foregoing example is merely one example; monitoring and/or measuring power output by and/or power consumption of a VCSEL light source may be performed in a number of suitable ways.

In some embodiments, the optical proximity sensor 106 includes a thermal mass coupled to each VCSEL of the VCSEL light sources to promote even temperature distribution between each VCSEL light source. In other cases, a thermally conductive layer can be disposed adjacent to or below each VCSEL light source.

In one specific implementation of the example introduced above, the optical proximity sensor 106 of the electronic device 102 includes a component enclosure that retains, encloses, and protects two VCSEL light sources. For this embodiment, a first VCSEL light source is referred to as the primary VCSEL and a second VCSEL light source is referred to as the auxiliary VCSEL light source.

As with other embodiments described herein, the primary VCSEL light source can be configured to emit a beam of laser light outwardly from the component enclosure of the optical proximity sensor 106. In the illustrated embodiment, the primary VCSEL light source is oriented to emit/radiate light in a direction generally perpendicular to an edge of a housing of the electronic device 102. It may be appreciated, however, that this is merely one example and that other emission or radiation directions are possible. (see, e.g., FIG. 2A)

As with other embodiments described herein, the primary VCSEL light source is further configured to receive a reflection of the emitted/radiated beam off the object 104. This reflection can result in self-mixing interference within the primary VCSEL light source which, in turn, can affect power output of the primary VCSEL light source. Accordingly, monitoring power output of the primary VCSEL light source (e.g., via monitoring an output of a photodiode, such as described above) can be used to determine and/or calculate the distance d and the velocity v of the object 104 relative to the electronic device 102. (see, e.g., Equations 1-2).

Also as with other embodiments described herein, the auxiliary VCSEL light source can be configured to emit a beam of light toward a reflective surface separated from the auxiliary VCSEL light source by a fixed reference distance.

In some cases, the reflective surface is an interior surface of the component enclosure of the optical proximity sensor 106. In other cases, the reflective surface is an exterior surface of the component enclosure of the optical proximity sensor 106. In yet other examples, the reflective surface is defined by a reflective or metallic material disposed onto (e.g., via physical vapor deposition or another suitable technique), or molded within (e.g., via insert molding or co-molding), a surface or body portion of the component enclosure of the optical proximity sensor 106.

As with other embodiments described herein, the auxiliary VCSEL light source is further configured to receive a reflection of the beam emitted therefrom off the reflective surface. This reflection can result in self-mixing interference within the auxiliary VCSEL light source which, in turn, can affect power consumption by and/or power output of the auxiliary VCSEL light source. As with the primary VCSEL light source a photodiode may be used to monitor power output by and/or power consumption of the auxiliary VCSEL light source which, in turn, can be used to determine and/or calculate a variation in the reference distance—if any. (see, e.g., Equations 1-2). Any detected or calculated variance in the reference distance can be used to calibrate, in real time, the output of the primary VCSEL light source.

The optical proximity sensor 106 and the electronic device 102 can be communicably or functionally coupled in any suitable manner. More specifically, the optical proximity sensor 106 can be configured to communicate distance and/or velocity information (which is calculated or otherwise determined based on self-mixing of the primary VCSEL light source calibrated based on self-mixing of the auxiliary VCSEL light source), to a processor or system of the electronic device 102 in any suitable manner, according to any protocol, in compliance with any suitable digital or analog form or format.

Furthermore, as noted above, the electronic device 102 can be any suitable electronic device including both stationary and portable electronic devices. In one embodiment, the electronic device 102 is a wearable electronic device, such as a smart watch. In this example, the electronic device 102 can leverage the optical proximity sensor 106 to determine a distance to a user (represented by the object 104) and a velocity of that user while that user is interacting with the electronic device 102. For example, the electronic device 102 can leverage a signal sent from the optical proximity sensor 106 to determine whether a user is wearing the smart watch or is directing the smart watch toward the user's face.

More specifically, in some embodiments, the electronic device 102 may be configured to perform a function upon determining that the user has to cross one or more thresholds, such as distance thresholds or velocity thresholds. Such thresholds may be variable or fixed and may be set by, and/or stored within, a memory of the electronic device 102. In some examples, the thresholds may be based on a user setting, an application setting, or an operating system setting or mode of operation. In other cases, such thresholds may be based, at least in part, on a particular application executed or instantiated by a processor of the electronic device 102. For example, a threshold set associated with a telephony application may be different from a threshold set associated with a gaming application. It may be appreciated that any suitable threshold or set of thresholds, stored or accessed in any suitable form or format may be used to inform one or more behaviors of the electronic device 102 in response to a signal received from the optical proximity sensor 106.

In one specific embodiment, the electronic device 102 can disable a screen of the electronic device 102 upon determining that a user is a far distance away from the electronic device 102.

In another specific embodiment, the electronic device 102 can modify a display or power setting of the electronic device 102 based on the distance and velocity of the user. Examples include, but may not be limited to: decreasing a brightness of a display or a display region upon receiving a signal from the optical proximity sensor 106 that the user is covering the display; increasing a brightness of a display upon receiving a signal from the optical proximity sensor 106 that the user is covering the display; highlighting a user interface element (e.g., an item of a list, a button, and the like) of a graphical user interface upon receiving a signal from the optical proximity sensor 106 that the user is hovering a finger near the display; highlighting or otherwise modifying a user interface element of a graphical user interface upon receiving a signal from the optical proximity sensor 106 that the user is hovering a finger near an input component of the electronic device 102 (e.g., rotary input device, push-button input device, touch input device, and so on); and so on.

In another embodiment, the electronic device 102 may be a portable electronic device such as a cellular phone. In these examples, the electronic device 102 can leverage a velocity or distance signal received from the optical proximity sensor 106 to determine an appropriate time to disable or enable a touch-sensitive display of the electronic device 102 when a user of the electronic device raises the cellular phone to the user's ear.

In another embodiment, the electronic device 102 may leverage a velocity or distance signal received from the optical proximity sensor 106 to determine whether the electronic device 102 is falling or will imminently impact a surface.

In another embodiment, the electronic device 102 may be a vehicle accessory or attachment. In these examples, the electronic device 102 can leverage a velocity or distance signal received from the optical proximity sensor 106 to determine a distance to, and/or a velocity of, another vehicle, pedestrian, or a road hazard.

In another embodiment, the electronic device 102 may position an optical proximity sensor, such as the optical proximity sensor 106, within an input/output communication port or a power port of the electronic device 102. In these examples, the electronic device 102 can leverage a velocity or distance signal received from the optical proximity sensor 106 to determine whether a cable is properly seated in the port, whether a cable is removed too quickly or in a manner that may cause damage to the electronic device 102, and so on.

It may be appreciated that the foregoing example embodiments are not exhaustive and that an optical proximity sensor, such as described herein, can be leveraged by an electronic device in any suitable manner to determine distance and/or velocity of a known or unknown object or surface relative to the electronic device.

For example, in some embodiments, an electronic device can include more than one optical proximity sensors, such as described herein. In another example, an electronic device can include an array of optical proximity sensors arranged in a pattern, such as in a line.

In many cases, an optical proximity sensor, such as described herein, can be disposed within a housing of an electronic device and aligned with a transparent aperture defined by the housing, but this may not be required. For example, in some embodiments, an optical proximity sensor can be disposed behind a display. In other cases, an optical proximity sensor can be disposed entirely within an electronic device housing. In these examples, the optical proximity sensor can be used to detect deflections or deformations in a surface of the electronic device that can result from a user applying a purposeful force to that surface. For example, in one embodiment, an optical proximity sensor is positioned entirely within a housing of an electronic device, behind a display. In this example, when a user of the electronic device applies a force to the display, the display may deform or bend, shortening the distance between the display and the optical proximity sensor. The optical proximity sensor, in turn, can detect and measure this deflection which can be correlated by a processor of the electronic device—and/or a processor of the optical proximity sensor—into a magnitude of force input.

The foregoing examples are not exhaustive; it may be appreciated that generally and broadly an electronic device can leverage one or more optical proximity sensors, such as described herein, for any suitable purpose or function.

Figure 2A:
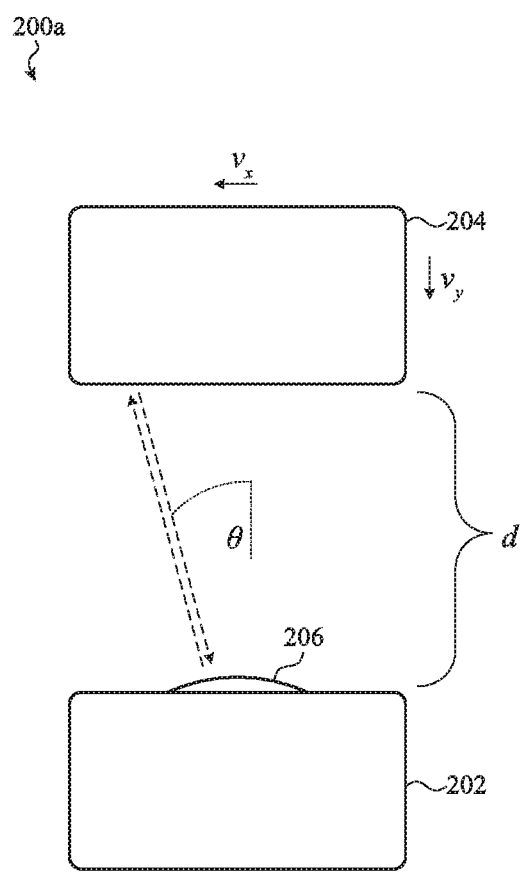
FIG. 2A depicts a schematic representation of another electronic device incorporating a proximity sensor, such as described herein, to determine a distance to, and/or a velocity of, an object near the electronic device.

For example, FIG. 2A depicts a schematic representation 200a of an electronic device 202 configured to measure a distance d to an object 204 and/or a velocity of the object 204 relative to an optical proximity sensor 206, such as described herein. In this example embodiment, the optical proximity sensor 206 can include a beam-shaping lens that redirects light emitted from the optical proximity sensor 206 to an angle θ. In this manner and as a result of this construction, the electronic device 202 and the optical proximity sensor 206 can determine velocity in multiple directions or along multiple axes (e.g., $v_x$ and $v_y$). In this manner, together (optionally) with one or more additional optical proximity sensors, the electronic device 202 can determine multi-axis velocity and distance.

Figure 2B:
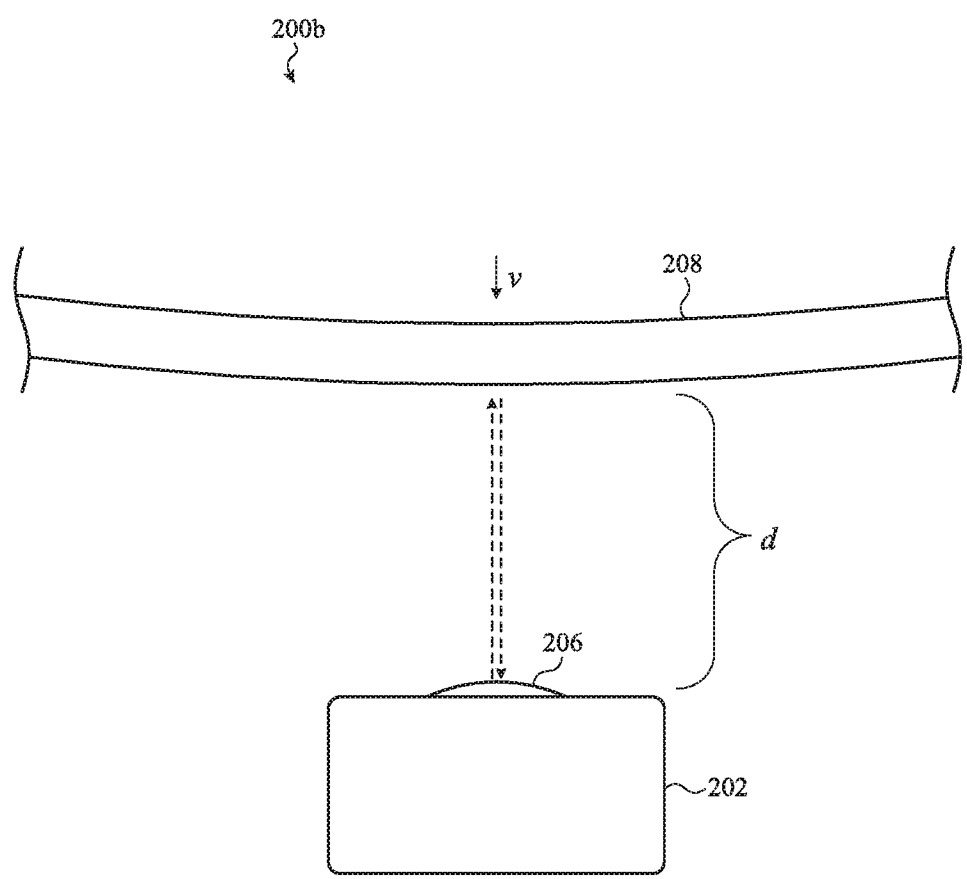
FIG. 2B depicts a schematic representation of another electronic device incorporating a proximity sensor, such as described herein, to determine a distance to, and/or a velocity of, a movable surface of the electronic device.

Still other embodiments can be implemented in other manners. For example, FIG. 2B depicts a schematic representation 200b of an electronic device 202 configured to leverage an optical proximity sensor 206 to measure a distance d to a flexible surface 208 and a velocity v of one or more deformations or flexions of that flexible surface 208. In this manner, and as a result of this construction, flexion of the flexible surface 208 can be quantified by the electronic device 202.

The foregoing embodiment depicted in FIGS. 1-2B and the various alternatives thereof and variations thereto are presented, generally, for purposes of explanation, and to facilitate an understanding of various configurations and constructions of an optical proximity sensor, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

For example, as noted above, an optical proximity sensor such as described herein, can be leveraged by an electronic device for, without limitation: determining a proximity of a user to the electronic device beyond a threshold; determining a distance separating a user and the electronic device; determining a distance separating a user's finger and the electronic device; determining a distance separating a user's finger and an input region (e.g., touch screen, force input sensor, physical input component, rotary input component) of the electronic device; determining a velocity with which a user's finger approaches the electronic device; determining a velocity or distance with which a surface of the electronic device deforms or deflects in response to an input force; a velocity or distance with which a housing portion of the electronic device deforms or deflects in response to an input force; and so on.

Expanding upon these and related examples, FIGS. 3A-3D are presented to depict various example use cases for an optical proximity sensor, such as described herein. These figures depict a wearable electronic device, such as a smart watch, but it may be appreciated that this is merely one example. An optical proximity sensor, such as described herein, can be incorporated into any suitable electronic device and leveraged for any suitable purpose.

Figure 3A:
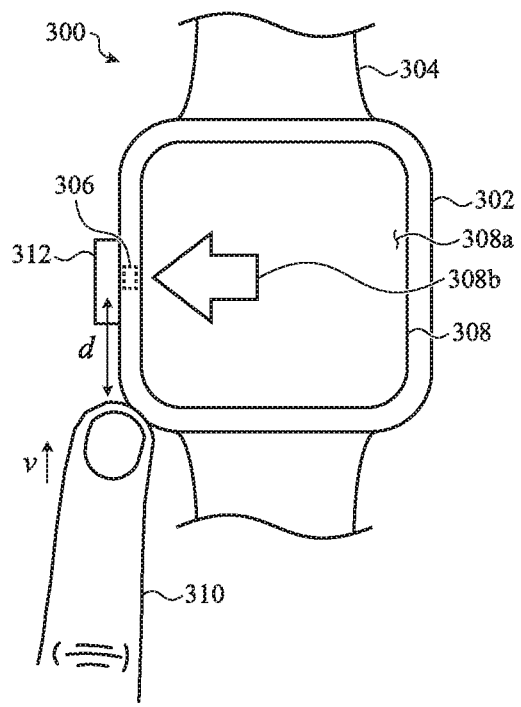
FIG. 3A depicts a schematic representation of an electronic device incorporating a proximity sensor, such as described herein, to determine a distance to, and/or a velocity of, a user's finger relative to an input region of the electronic device.

For example, FIG. 3A depicts a wearable electronic device 300 including a housing 302 that can be worn by a user (e.g., via a wristband 304). In this example, an optical proximity sensor 306 can be included within the housing 302 and positioned relative to a periphery or bezel region of a display 308 that defines a graphical user interface 308a with which a user can interact. As a result of this construction, the optical proximity sensor 306 can be configured to and oriented to detect, measure, or otherwise determine a distance d and/or a velocity v of a user's finger 310 relative to an input component 312. The input component 312 can be any suitable input component including, but not limited to: a rotating input component (e.g., a crown); a press-button input component; a solid-state input component; and so on.

In this example embodiment, the wearable electronic device 300 can be configured to perform a first function upon determining that the user's finger 310 is approaching the input component 312, to perform a second function upon determining that the user's finger 310 is departing or moving away from the input component 312, to perform a third function upon determining that the user's finger 310 is hovering near or on the input component 312, and so on. It may be appreciated that these examples are not exhaustive and that the wearable electronic device 300 can perform any suitable function or operation based on the distance d and/or the velocity v of the user's finger 310 relative to the input component 312 as determined by the optical proximity sensor.

For example, in one embodiment, the wearable electronic device 300 can modify a position, characteristic, size, color, or other quality of a graphical user interface element 308b in response to a change in the distance d between the input component 312 and the user's finger 310.

Figure 3B:
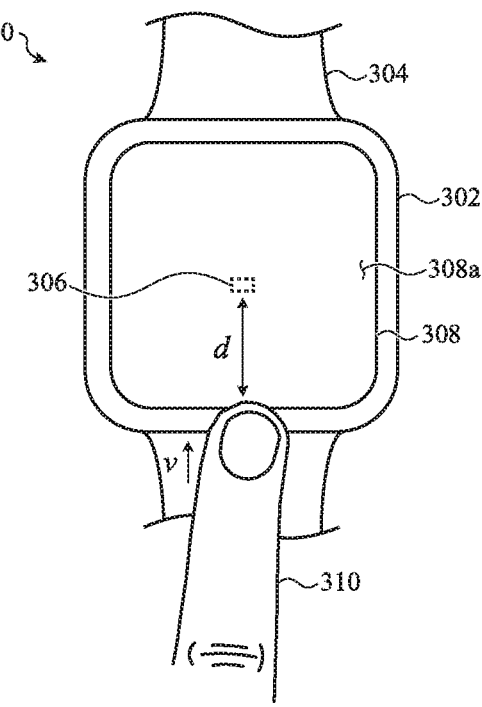
FIG. 3B depicts a schematic representation of an electronic device incorporating a proximity sensor, such as described herein, to determine a distance to, and/or a velocity of, a user's finger relative to a touch-input region of the electronic device.

In another example, FIG. 3B depicts a wearable electronic device 300 including a housing 302 configured to couple to a user via a wristband 304. An optical proximity sensor 306, such as described herein, can be disposed behind a display 308 that renders a graphical user interface 308a. In one example, the optical proximity sensor 306 is configured to emit light through an inter-pixel region of the display 308.

In this example, the optical proximity sensor 306 can be configured to and oriented to detect, measure, or otherwise determine a distance d and/or a velocity v of a user's finger 310 relative to the display 308 and/or to the graphical user interface 308a. The display 308 can be implemented as or with, without limitation: a touch-sensitive screen or display; a force-sensitive screen or display; a haptic-output surface; and so on.

In this example embodiment, as with other embodiments described herein, the wearable electronic device 300 can be configured to perform any suitable function or operation based on the distance d and/or the velocity v—and/or changes therein over time—of the user's finger 310 relative to the display 308 as determined by the optical proximity sensor.

Figure 3C:
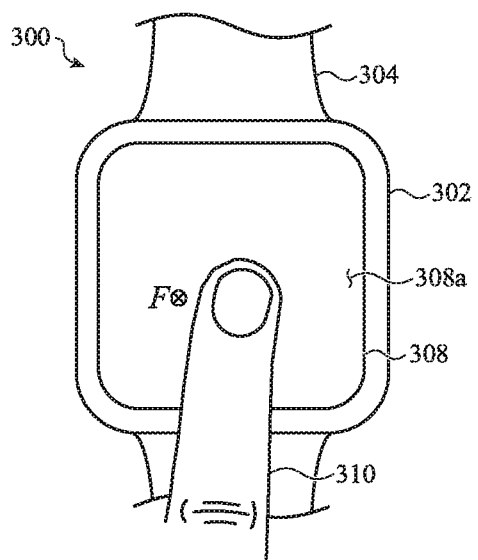
FIG. 3C depicts a schematic representation of an electronic device incorporating a proximity sensor, such as described herein, to determine a distance to, and/or a velocity of, a movable surface of the electronic device against which a user of the electronic device can exert a force.

In another example, FIG. 3C depicts a wearable electronic device 300 including a housing 302 that can be attached to a user via a wristband 304. An optical proximity sensor, such as described herein, can be disposed within the housing 302. In this example, the optical proximity sensor can be configured to and oriented to detect, measure, or otherwise determine a distance d and/or a velocity v of a deflection of a display 308 that results from a downward force applied by the user's finger 310 to a graphical user interface 308a rendered by the display 308. The display 308 can be configured in the same manner as described in reference to FIG. 3B, and this description is not repeated.

In this example embodiment, as with other embodiments described herein, the wearable electronic device 300 can be configured to perform any suitable function or operation based on the distance d and/or the velocity v—and/or changes therein over time—of the user's finger 310 relative to the display 308 as determined by the optical proximity sensor. In many examples, the wearable electronic device 300 can be configured to correlate or otherwise convert at least one of a distance d and/or a velocity v of the deflection of an display 308 into a magnitude of force input F.

Figure 3D:
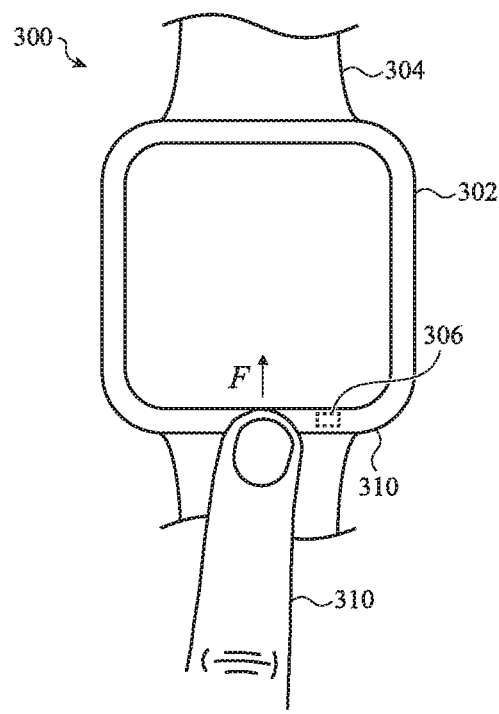
FIG. 3D depicts another schematic representation of an electronic device incorporating a proximity sensor, such as described herein, to determine a distance to, and/or a velocity of, a movable surface of the electronic device against which a user of the electronic device can exert a force.

In yet another example, FIG. 3D depicts a wearable electronic device 300 including a housing 302 that can be attached to a user via a wristband 304. An optical proximity sensor 306, such as described herein, can be disposed within the housing 302 adjacent to a sidewall of the housing 302. More specifically, in this example, the optical proximity sensor 306 can be configured to and oriented to detect, measure, or otherwise determine a distance d and/or a velocity v of a deflection of a housing sidewall or housing section—identified in the figure as the sidewall 310 that results from a force F applied by the user 304.

In this example embodiment, as with other embodiments described herein, the wearable electronic device 300 can be configured to perform any suitable function or operation based on the determine magnitude of the force F—and/or changes therein over time—applied by the user's finger 310 as determined by the optical proximity sensor.

The foregoing embodiment depicted in FIGS. 3A-3D and the various alternatives thereof and variations thereto are presented, generally, for purposes of explanation, and to facilitate an understanding of various possible means by which an optical proximity sensor, such as described herein, can be leveraged or otherwise used by an electronic device. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

Figure 4:
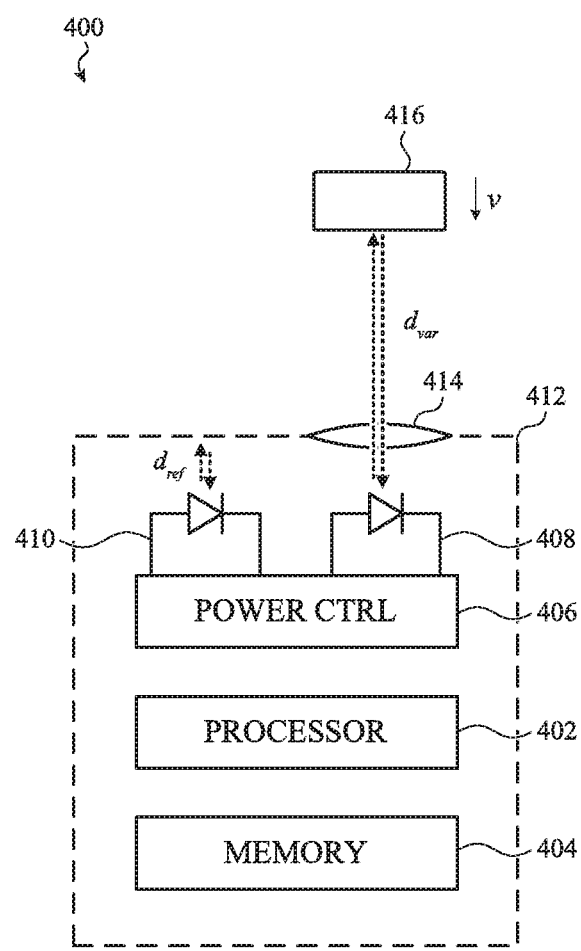
FIG. 4 depicts a system diagram of a proximity sensor, such as described herein.

For example, it may be appreciated that, generally and broadly, and in view of the foregoing examples, an optical proximity sensor, such as described herein, can be used in a number of suitable ways to detect distance and/or velocity of any suitable surface. FIG. 4 depicts a system diagram of an optical proximity sensor 400, such as described herein. In particular, the optical proximity sensor 400 includes a processor 402, a memory 404 (optional), and a power controller 406 each of which may be interconnected and/or communicably or conductively coupled in any suitable manner.

As described herein, the term "processor" refers to any software and/or hardware-implemented data processing device or circuit physically and/or structurally configured to instantiate one or more classes or objects that are purpose-configured to perform specific transformations of data including operations represented as code and/or instructions included in a program that can be stored within, and accessed from, a memory, such as the memory 404. This term is meant to encompass a single processor or processing unit, multiple processors, multiple processing units, analog or digital circuits, application-specific integrated circuits, or other suitably configured computing element or combination of elements.

The power controller 406 is coupled to a primary VCSEL light source 408 and an auxiliary VCSEL light source 410. Each of these components—along with other components of the optical proximity sensor 400 that may be required or preferred in particular embodiments or implementations—can be disposed in whole or in part within a component enclosure 412. The optical proximity sensor 400 also includes a window 414 configured to allow light emitted from the primary VCSEL light source 408 to pass through the component enclosure 412 to illuminate a surface of an object 416.

In these examples, the processor 402 can be configured to cause the power controller 406 to generate a triangular current waveform (or other suitable periodic or non-periodic waveform) to simultaneously inject current into the primary VCSEL light source 408 and the auxiliary VCSEL light source 410. As noted with respect to other embodiments described herein, the primary VCSEL light source 408 and the auxiliary VCSEL light source 410 can each be configured to operate in a manner that leverages effects of self-mixing.

For simplicity, the operation of injecting current, whether modulated or otherwise, into a VCSEL light source to emit light and to promoting self-mixing, whether by a power controller or processor such as described herein, is referred to herein as "driving" a light source.

In the illustrated embodiment, the primary VCSEL light source 408 is aligned with the window 414 such that light emitted from the primary VCSEL light source 408 traverses the window 414 and illuminates a surface of the object 416 (which may be a user, an internal surface of an electronic device, and so on).

Reflections from the object 416 traverse the window 414 and reenter the primary VCSEL light source 408 to cause self-mixing interference that is directly related to the distance $d_{var}$ separating the object 416 from the primary VCSEL light source 408 and, additionally directly related to the velocity of the object 416 relative to the primary VCSEL light source 408. In some cases, the power controller 406 can be further configured to monitor power output from one or more photodiodes optically coupled to the primary VCSEL light source 408 in order to quantify and/or otherwise determine variations in power output of the primary VCSEL light source 408 that result from the self-mixing effects. (see, e.g., Equations 1-2).

Conversely, in the illustrated embodiment, the auxiliary VCSEL light source 410 is positioned within the component enclosure 412 such that light emitted from the auxiliary VCSEL light source 410 only illuminates an internal surface of the component enclosure 412.

Reflections from the internal surface of the component enclosure 412 reenter the auxiliary VCSEL light source 410 to cause self-mixing interference that is directly related to the distance $d_{ref}$ separating the internal surface of the component enclosure 412 from the auxiliary VCSEL light source 410. In some cases, as with the primary VCSEL light source 408 described above, the power controller 406 can be further configured to monitor power output from one or more photodiodes optically coupled to the auxiliary VCSEL light source 410 in order to quantify and/or otherwise determine variations in power output of the auxiliary VCSEL light source 410 that result from the self-mixing effects. (see, e.g., Equations 1-2).

In these embodiments, the processor 402 can be configured to receive one or more signals from the power controller 406 that correspond to one or more power use and/or power output characteristics of the auxiliary VCSEL light source 410 and the primary VCSEL light source 408. Thereafter, the processor 402 can be configured to calibrate and/or otherwise adjust an output corresponding to the primary VCSEL light source 408 based on an output corresponding to the auxiliary VCSEL light source 410 that relates to the fixed reference distance $d_{ref}$.

It may be appreciated that the calibration operation described herein can be performed by the processor 402 at any suitable time with any suitable form or format of data output from the power controller 406. For example, in some implementations, the processor 402 can be configured to modify or calibrate raw power consumption data—whether digital or analog—corresponding to the primary VCSEL light source 408 whereas in other cases, the processor 402 can be configured to modify or calibrate distance or velocity calculations. In still further examples, more than one calibration operation can be performed in sequence or in parallel on any suitable data.

In this manner, and a result of the foregoing described example system architecture, an optical proximity sensor, such as described herein, is generally and broadly configured to (1) determine in real time or substantially real time a distance and/or velocity calculation based on self-mixing interferometry and (2) to calibrate those measurements based on a second self-mixing interferometry calculation that is based on a fixed, reference distance.

More broadly, these foregoing embodiments depicted in FIGS. 3A-3D and the various alternatives thereof and variations thereto are presented, generally, for purposes of explanation, and to facilitate an understanding of various optical proximity sensor system architectures, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

For example, it may be appreciated that an optical proximity sensor and, in particular, a primary and auxiliary VCSEL associated therewith can be arranged and constructed in a variety of ways. As such, FIGS. 5-10 are presented to illustrate various example embodiments of an optical proximity sensor, such as described herein.

Figure 5:
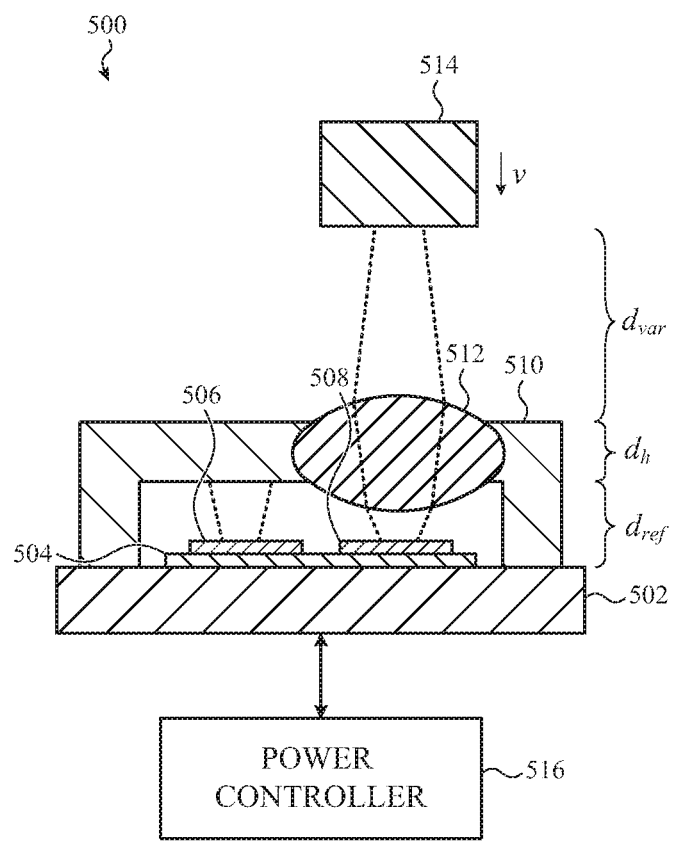
FIG. 5 depicts a simplified cross section view of a proximity sensor, such as described herein.

In particular, FIG. 5 depicts a simplified cross section view of an optical proximity sensor 500, such as described herein. The optical proximity sensor 500 is formed, at least in part, on a substrate 502 to which a semiconductor die 504 can be conductively and mechanically coupled. The semiconductor die 504 includes two separate VCSEL regions, each of which can include one or more individual VCSELs. These regions are identified in the figure as the auxiliary VCSEL region 506 and the primary VCSEL region 508. As noted with respect to other embodiments described herein, the auxiliary VCSEL region 506 and the primary VCSEL region 508 may be physically proximate (or immediately adjacent) to one another specifically such that each experiences substantially the same environmental conditions (e.g., temperature).

The semiconductor die 504, in addition to the auxiliary VCSEL region 506 and the primary VCSEL region 508 are enclosed on the substrate 502 by a component enclosure 510. An optical adapter 512 is insert molded or otherwise disposed into the component enclosure 510 and aligned above a central region or emission axis of the primary VCSEL region 508. In many examples, the optical adapter 512 may serve as a lens, but this is not required.

As a result of this construction, a beam of light emitted from the primary VCSEL region 508 can traverse the optical adapter 512 to illuminate an object 514. As with other embodiments described herein, a portion of the light radiated/emitted from the primary VCSEL region 508 can reflect from the object 514 and return to the primary VCSEL region 508 to facilitate self-mixing interferometry detection and/or measurement of a distance $d_{var}$ (and/or a velocity v) that separates an exterior surface of the component enclosure 510 from the surface of the object 514.

Conversely, a beam of light emitted from the auxiliary VCSEL region 506 does not traverse the optical adapter 512 and, instead, reflects directly from an interior surface of the component enclosure 510 to facilitate self-mixing interferometry detection and/or measurement of a fixed reference distance $d_{ref}$.

As noted with respect to other embodiments described herein, interferometric calculations and/or measurements to cancel or mitigate effects of temperature and/or other environmental conditions can be performed in whole or in part by a power controller 516 coupled to the primary VCSEL region 508 and the auxiliary VCSEL region 506. The power controller 516 may be configured in the same manner as described above in reference to FIG. 4; this description is not repeated.

In this example embodiment, the component enclosure 510 may be substantially opaque, although this may not be required. Similarly, in this example, the optical adapter 512 may be insert molded or otherwise formed from a separate material from the component enclosure 510; this is also not expressly required.

Figure 6:
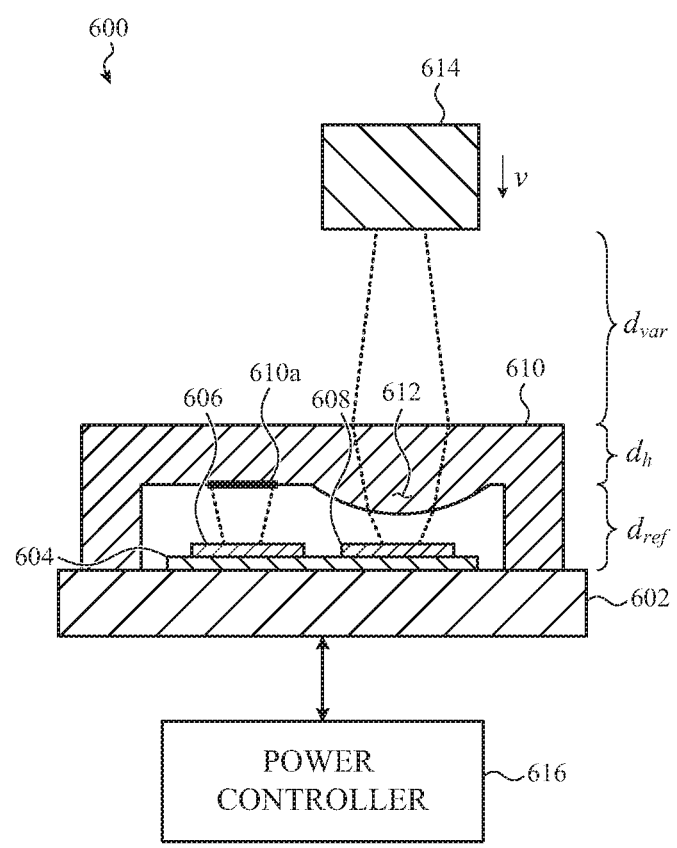
FIG. 6 depicts a simplified cross section view of a proximity sensor, such as described herein.

For example, FIG. 6 depicts a simplified cross section view of an optical proximity sensor 600, such as described herein. As with other embodiments described herein, the optical proximity sensor 600 is formed, at least in part, on a substrate 602 to which a semiconductor die 604 can be conductively and mechanically coupled. The semiconductor die 604 includes two separate VCSEL regions, identified in the figure as the auxiliary VCSEL region 606 and the primary VCSEL region 608. These regions are defined physically proximate to one another in order to ensure substantially uniform environmental conditions.

The semiconductor die 604, in addition to the auxiliary VCSEL region 606 and the primary VCSEL region 608, are enclosed on the substrate 602 by a transparent component enclosure 610. The transparent component enclosure 610 includes a lensing region 612 aligned above a central region or emission axis of the primary VCSEL region 608. In many examples, the lensing region 612 may serve as a convex lens, but this is not required.

As a result of this construction, as with other embodiments described herein, a beam of light emitted from the primary VCSEL region 608 can traverse the lensing region 612 of the transparent component enclosure 610 to illuminate an object 614. As with other embodiments described herein, a portion of the light radiated/emitted from the primary VCSEL region 608 can reflect from the object 614 and return to the primary VCSEL region 608 to facilitate self-mixing interferometry detection and/or measurement of a distance $d_{var}$ (and/or a velocity v) that separates an exterior surface of the transparent component enclosure 610 from the surface of the object 614.

Conversely, a beam of light emitted from the auxiliary VCSEL region 606 does not traverse the lensing region 612 of the transparent component enclosure 610 and, instead, reflects directly from an interior surface of the transparent component enclosure 610 to facilitate self-mixing interferometry detection and/or measurement of a fixed reference distance $d_{ref}$. In many embodiments, the transparent component enclosure 610 can optionally include a reflective region 610a to increase the quantity of light reflected back to the auxiliary VCSEL region 606.

In some cases, the reflective region 610a of the transparent component enclosure 610 can be formed by depositing a reflective ink or paint onto an interior or exterior surface of the transparent component enclosure 610. In other cases, the reflective region 610a of the transparent component enclosure 610 can be formed by inserting (e.g., via insert molding or co-molding) a reflective material such as metal or a multilayer dielectric stack (having high reflectivity) into the transparent component enclosure 610. In other cases, the reflective region 610a of the transparent component enclosure 610 can be formed by adhering or otherwise attaching a reflective material such as metal into the transparent component enclosure 610. In still other cases, the reflective region 610a of the transparent component enclosure 610 can be formed by introducing an optical index of refraction mismatch with transparent component enclosure 610. It may be appreciated that these examples are not exhaustive and that other methods of increasing reflectivity of the transparent component enclosure 610 can be suitable for other embodiments.

As noted with respect to other embodiments described herein, interferometric calculations and/or measurements to cancel or mitigate effects of temperature and/or other environmental conditions can be performed in whole or in part by a power controller 616 coupled to the primary VCSEL region 608 and the auxiliary VCSEL region 606. The power controller 616 may be configured in the same manner as described above in reference to FIG. 4; this description is not repeated.

Figure 7:
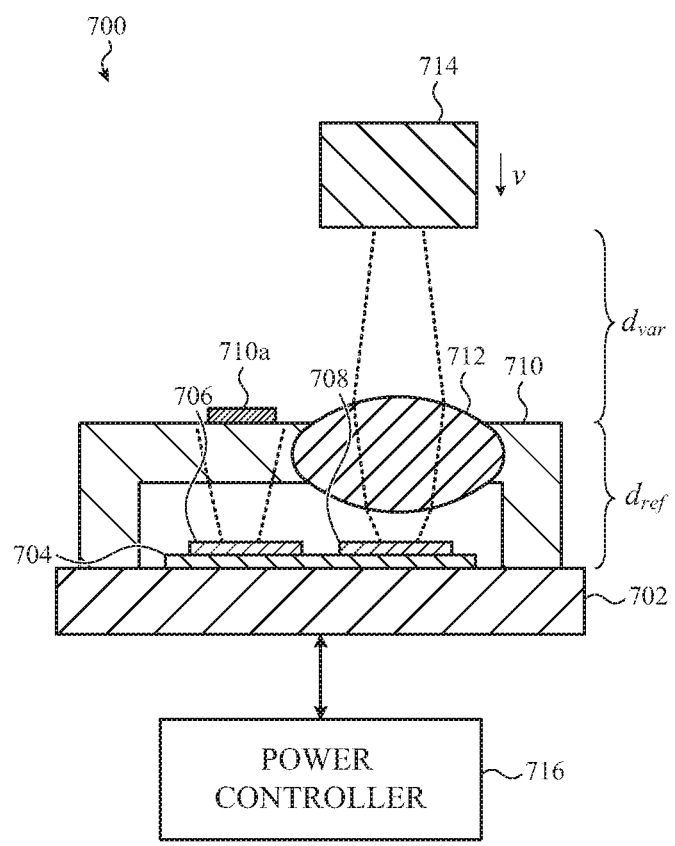
FIG. 7 depicts a simplified cross section view of a proximity sensor, such as described herein.

Still further constructions are possible. For example, FIG. 7 depicts a simplified cross section view of an optical proximity sensor 700, such as described herein. As with other embodiments described herein, the optical proximity sensor 700 is formed, at least in part, on a substrate 702 to which a semiconductor die 704 can be conductively and mechanically coupled. The semiconductor die 704 includes two separate VCSEL regions, identified in the figure as the auxiliary VCSEL region 706 and the primary VCSEL region 708. As with other embodiments described herein, the auxiliary VCSEL region 706 and the primary VCSEL region 708 are defined and/or disposed physically proximate to one another.

The semiconductor die 704 is enclosed on the substrate 702 by a transparent component enclosure 710. Similar to the embodiment depicted in FIG. 5, an optical adapter 712 can be insert molded, or otherwise disposed into, the transparent component enclosure 710 and aligned above a central region or emission axis of the primary VCSEL region 708. As noted above, the optical adapter 712 may serve as a lens, but this is not required.

As a result of this construction, and as with other embodiments described herein, a beam of light emitted from the primary VCSEL region 708 can traverse the optical adapter 712 of the transparent component enclosure 710 to illuminate an object 714. A reflection therefrom can return to the primary VCSEL region 708 to facilitate self-mixing interferometry detection and/or measurement of a distance $d_{var}$ (and/or a velocity v) that separates an exterior surface of the transparent component enclosure 710 from the surface of the object 714.

Conversely, a beam of light emitted from the auxiliary VCSEL region 706 does not traverse the optical adapter 712 of the transparent component enclosure 710 and, instead, reflects directly from an exterior surface of the transparent component enclosure 710 to facilitate self-mixing interferometry detection and/or measurement of a fixed reference distance $d_{ref}$. In this embodiment, in contrast to the embodiment shown in FIG. 6, the transparent component enclosure 710 can optionally include a reflective region 710a to increase the quantity of light reflected back to the auxiliary VCSEL region 706. The reflective region 710a can be configured and/or coupled to the transparent component enclosure 710 in the same manner as described above in reference to FIG. 6; this description is not repeated.

As noted with respect to other embodiments described herein, interferometric calculations and/or measurements to cancel or mitigate effects of temperature and/or other environmental conditions can be performed in whole or in part by a power controller 716 coupled to the primary VCSEL region 708 and the auxiliary VCSEL region 706. The power controller 716 may be configured in the same manner as described above in reference to FIG. 4; this description is not repeated.

Figure 8:
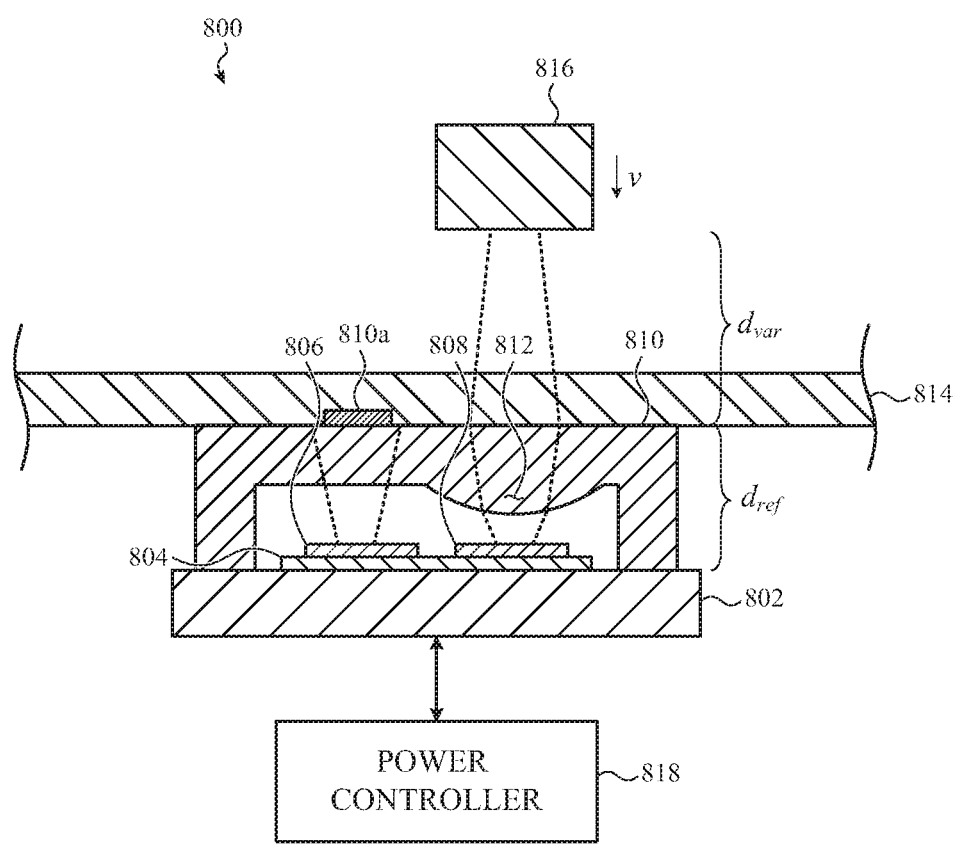
FIG. 8 depicts a simplified cross section view of a proximity sensor, such as described herein.

In another example embodiment, FIG. 8 depicts a simplified cross section view of an optical proximity sensor 800, such as described herein. As with other embodiments described herein, the optical proximity sensor 800 is formed, at least in part, on a substrate 802 to which a semiconductor die 804 is conductively and mechanically coupled. The semiconductor die 804 includes two separate VCSEL regions, identified in the figure as the auxiliary VCSEL region 806 and the primary VCSEL region 808. These regions are disposed physically proximate to one another.

The semiconductor die 804 is enclosed on the substrate 802 by a transparent component enclosure 810. Similar to the embodiment depicted in FIG. 6, the transparent component enclosure 810 can include a lensing region 812 aligned with an emission/radiation axis of the primary VCSEL region 808. In this embodiment, the optical proximity sensor 800 can be positioned behind and/or otherwise coupled to, a transparent substrate 814. In one example embodiment, the transparent substrate 814 is a cover glass positioned over a display of an electronic device such as a smart watch or a cellular phone. In many cases, the optical proximity sensor 800 is coupled to the transparent substrate 814 with an optically clear adhesive.

As a result of this construction, a beam of light emitted from the primary VCSEL region 808 can illuminate an object 816 through the transparent substrate 814. A reflection therefrom can return to the primary VCSEL region 808 to facilitate self-mixing interferometry detection and/or measurement of a distance $d_{var}$ (and/or a velocity v) that separates an exterior surface of the transparent component enclosure 810 from the surface of the object 816.

Conversely, as with other embodiments described herein, a beam of light emitted from the auxiliary VCSEL region 806 does not traverse the lensing region 812 of the transparent component enclosure 810 and, instead, reflects directly from an exterior surface of the transparent component enclosure 810 to facilitate self-mixing interferometry detection and/or measurement of a fixed reference distance $d_{ref}$. In this embodiment, in contrast to the embodiment shown in FIG. 6, the transparent component enclosure 810 can optionally include a reflective region 810a to increase the quantity of light reflected back to the auxiliary VCSEL region 806. The reflective region 810a can be configured and/or coupled to the transparent component enclosure 810 in the same manner as described above in reference to FIG. 6; this description is not repeated.

As noted with respect to other embodiments described herein, interferometric calculations and/or measurements to cancel or mitigate effects of temperature and/or other environmental conditions can be performed in whole or in part by a power controller 818 coupled to the primary VCSEL region 808 and the auxiliary VCSEL region 806. The power controller 818 may be configured in the same manner as described above in reference to FIG. 4; this description is not repeated.

Figure 9:
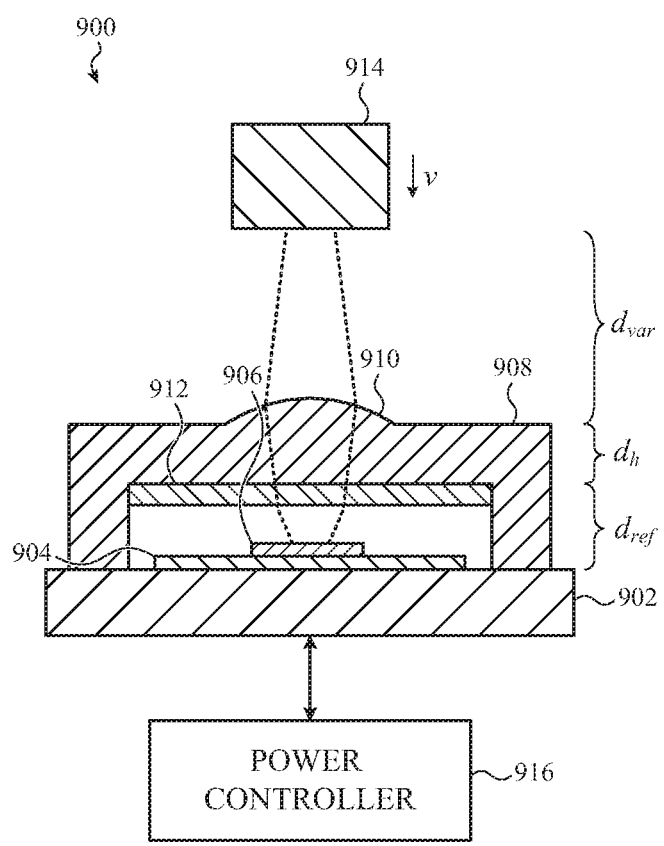
FIG. 9 depicts a simplified cross section view of a proximity sensor, such as described herein.

Still further embodiments may not require an auxiliary VCSEL region. For example, FIG. 9 depicts a simplified cross section view of an optical proximity sensor 900. The optical proximity sensor 900 includes a substrate 902 coupled to a semiconductor die 904 defining a primary VCSEL region 906. The semiconductor die 904 and the primary VCSEL region 906 are enclosed against the substrate 902 by a transparent component enclosure 908 that can, similar to other embodiments described herein, optionally include a lensing region 910. In this example embodiment, a partially-transparent layer 912 is disposed, formed, or otherwise coupled to an interior surface of the transparent component enclosure 908. In this manner, the partially-transparent layer 912 can reflect a portion of light emitted/radiated from the primary VCSEL region 906 back to the primary VCSEL region 906. In addition, the partially-transparent layer 912 can transmit a portion of light emitted/radiated from the primary VCSEL region 906 toward an object 914.

As a result of this construction, a beam of light emitted from the primary VCSEL region 906 can illuminate the object 914 through the partially-transparent layer 912. As with other embodiments described herein, a reflection from the object 914 can return to the primary VCSEL region 906 to facilitate self-mixing interferometry detection and/or measurement of a distance $d_{var}$ (and/or a velocity v) that separates an exterior surface of the transparent component enclosure 908 from the surface of the object 914.

In addition, the portion of light reflected from the partially-transparent layer 912 facilitates self-mixing interferometry detection and/or measurement of the fixed reference distance $d_{ref}$.

As noted with respect to other embodiments described herein, interferometric calculations and/or measurements to cancel or mitigate effects of temperature and/or other environmental conditions can be performed in whole or in part by a power controller 916 coupled to the primary VCSEL region 906. The power controller 916 may be configured in the same manner as described above in reference to FIG. 4; this description is not repeated.

Figure 10:
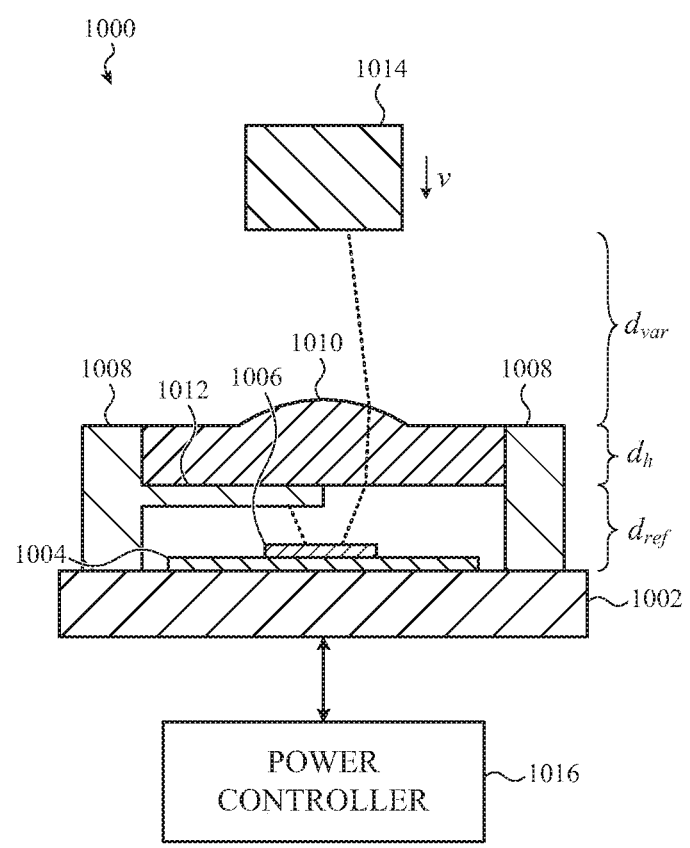
FIG. 10 depicts a simplified cross section view of a proximity sensor, such as described herein.

In still further embodiments, a partially-transparent layer may not be required. For example, FIG. 10 depicts an optical proximity sensor 1000, such as described herein. In this example, a substrate 1002 is coupled to a semiconductor die 1004 that defines a primary VCSEL region 1006. In this example, however, a component enclosure 1008 can be formed together with an optical adapter 1010 that can, optionally, perform one or more lensing functions. The component enclosure 1008 also includes a shelf 1012 that at least partially blocks (e.g., reflects) light emitted from the primary VCSEL region 1006. In this manner, interferometric calculations and/or measurements to cancel or mitigate effects of temperature and/or other environmental conditions and to determine a distance to and/or a velocity of an object 1014 can be performed in whole or in part by a power controller 1016 coupled to the primary VCSEL region 1006.

The foregoing embodiment depicted in FIGS. 5-10 and the various alternatives thereof and variations thereto are presented, generally, for purposes of explanation, and to facilitate an understanding of various possible constructions of an optical proximity sensor, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

Figure 11:
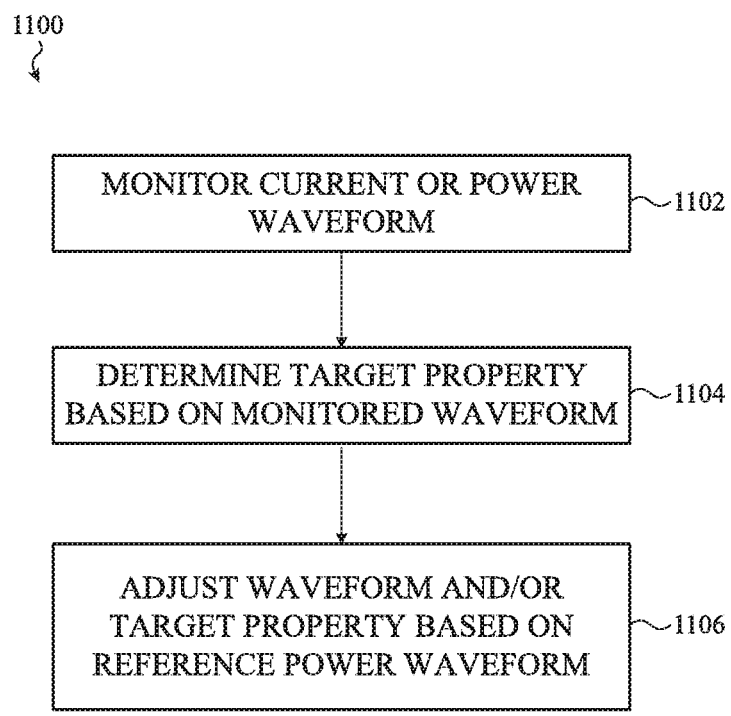
FIG. 11 is a flowchart depicting example operations of a method of operating a proximity sensor, such as described herein.

FIG. 11 is a flowchart depicting example operations of a method of operating a proximity sensor, such as described herein. The method 1100 includes operation 1102 in which a current or power waveform of a VCSEL is monitored. This method operation can be performed in whole or in part by a power controller or a processor such as described herein. The method 1100 further includes operation 1104 in which a target property is determined based on the monitored waveform of operation 1102. Example target properties include distance, velocity, and/or acceleration. In further examples, target properties can include one or more calculated quantities such as a change in distance over time, a direction or magnitude of velocity, and/or a magnitude of force applied to a surface to cause that surface to deflect or deform by a particular distance. The method 1100 further includes operation 1106 in which a target property value is updated in response to a change in the monitored waveform of operation 1102.

Figure 12:
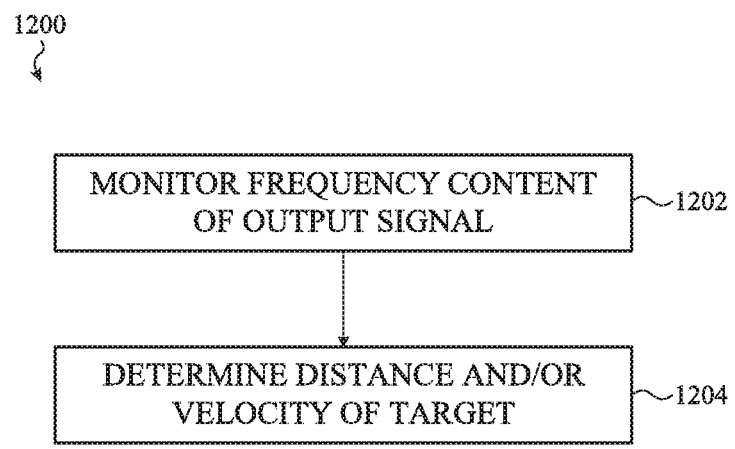
FIG. 12 is a flowchart depicting example operations of a method of operating a proximity sensor, such as described herein.

FIG. 12 is a flowchart depicting example operations of a method of operating a proximity sensor, such as described herein. The method 1200 includes operation 1202 in which frequency content of an output signal (e.g., of a photodiode optically coupled to a VCSEL such as described herein) is monitored. Next, at operation 1204, distance and/or velocity information can be determined based on the monitored frequency content of operation 1202.

One may appreciate that, although many embodiments are disclosed above, the operations and steps presented with respect to methods and techniques described herein are meant as exemplary and accordingly are not exhaustive. One may further appreciate that alternate step order or fewer or additional operations may be required or desired for particular embodiments.

Although the disclosure above is described in terms of various exemplary embodiments and implementations, it should be understood that the various features, aspects, and functionality described in one or more of the individual embodiments are not limited in their applicability to the particular embodiment with which they are described, but instead can be applied, alone or in various combinations, to one or more of the some embodiments of the invention, whether or not such embodiments are described and whether or not such features are presented as being a part of a described embodiment. Thus, the breadth and scope of the present invention should not be limited by any of the above-described exemplary embodiments but are instead defined by the claims herein presented.

What is claimed is:

1. An optical proximity sensor comprising:
an enclosure defining an aperture and an internal surface;
a substrate within the enclosure disposed opposite the aperture and defining an upper surface facing the aperture, the upper surface of the substrate separated from the internal surface of the enclosure by a distance;
a primary VCSEL within the enclosure, disposed on the upper surface of the substrate, and oriented to emit a first beam of light through the aperture, exiting the aperture and illuminating an object external to the enclosure resulting in a first reflection returning to the primary VCSEL via the aperture to induce a first self-mixing interference;
an auxiliary VCSEL within the enclosure, disposed on the upper surface of the substrate adjacent to the primary VCSEL, and oriented to emit a second beam of light toward the internal surface of the enclosure thereby illuminating the internal surface resulting in a second reflection returning to the auxiliary VCSEL to induce a second self-mixing interference; and
a power controller configured to:
  determine a power consumption of the primary VCSEL light source and the auxiliary VCSEL light source by monitoring output of a first photodiode and second photodiode each respectively optically coupled to the primary VCSEL and auxiliary VCSEL respectively;
  determine a distance to the object based, at least in part, on the determined power consumption of the primary VCSEL; and
  modify at least one of the determined distance to the object or the determined power consumption of the primary VCSEL based, at least in part, on the power consumption of the auxiliary VCSEL.

2. The optical proximity sensor of claim 1, wherein the power controller is configured to drive each of the primary VCSEL and the auxiliary VCSEL.

3. The optical proximity sensor of claim 1, wherein the power controller is configured to drive each of the primary VCSEL light source and the auxiliary VCSEL light source with a triangular current waveform.

4. The optical proximity sensor of claim 1, wherein the power controller is configured to determine a velocity of the object based, at least in part, on the power consumption of the primary VCSEL.

5. The optical proximity sensor of claim 1, wherein the auxiliary VCSEL is disposed adjacent to the primary VCSEL such that the primary VCSEL and the auxiliary VCSEL experience substantially the same thermal environment.

6. The optical proximity sensor of claim 1, further comprising a transparent optical adapter disposed within the aperture.

7. The optical proximity sensor of claim 6, wherein the optical adapter comprises a lens.

8. The optical proximity sensor of claim 6, wherein the enclosure is formed from an opaque material.

9. An optical proximity sensor comprising:
an enclosure formed from an optically opaque material and defining an aperture and an internal surface;
a substrate disposed within the enclosure;
a primary light source formed on a surface of the substrate and oriented to emit a first coherent beam of light in a first direction through the aperture so as to at least partially reflect as a reflection from an object external to the enclosure, the reflection at least partially returning to the primary light source to induce a self-mixing effect;
a first photodiode optically coupled to the primary light source;
an auxiliary light source formed on the surface adjacent to the primary light source and oriented to emit a second coherent beam of light in a second direction toward a reflective material disposed on the internal surface of the enclosure, the reflective material separated from the auxiliary light source by a fixed and known distance;
a second photodiode optically coupled to the auxiliary light source; and
a power controller configured to:
monitor a power output of the first photodiode and the second photodiode;
determine a property of the object reflecting the first beam of light based, at least in part, on power output of the first photodiode; and
modify at least one of the determined property or the determined power output of the first photodiode based, at least in part, on determined power output of the second photodiode.

10. The optical proximity sensor of claim 9, wherein the property is one of distance, velocity, or acceleration of the object relative to the optical proximity sensor.

11. The optical proximity sensor of claim 9, wherein the reflective surface is formed from at least one of a metal material or a multilayer dielectric stack.

12. The optical proximity sensor of claim 9, wherein the object is an interior surface of a housing of an electronic device, the interior surface opposite to an exterior surface of the housing that may be pressed by a user of the electronic device, thereby deforming the housing, modifying the reflection.

13. A method of determining distance between an object and an electronic device, the method comprising:
emitting, from a first light source formed on a substrate in an optical proximity sensor, a first coherent beam of light toward the object;
emitting, from a second light source formed on the substrate adjacent to the first light source, a second coherent beam of light toward a surface that is interior to the electronic device and that is separated from the second light source by a known and fixed distance;
determining variations in power output of the first light source and the second light source attributable to self-mixing interference effects by monitoring power output from a first and second photodiode respectively optically coupled to the first light source and the second light source;
determining a first distance measurement to the object based on the determined variations in power output of the first light source;
determining a second distance measurement to the surface based on the determined variations in power output of the second light source; and
modifying the first distance measurement based on the second distance measurement.

14. The method of claim 13, wherein a distance separating the second light source from the surface is a fixed distance.

15. The method of claim 14, further comprising modifying the first distance based on the second distance measurement and the fixed distance measurement.

16. The method of claim 13, wherein each of the first light source and the second light source is a VCSEL light source.

17. The method of claim 13, further comprising driving the first light source and the second light source with a triangular current waveform.

18. The method of claim 13, further comprising:
determining a velocity of the object based on self-mixing interference effects of the first light source; and
modifying the velocity based, at least in part, on the second distance measurement.

* * * * *